US007847885B2

(12) United States Patent
Broer et al.

(10) Patent No.: US 7,847,885 B2
(45) Date of Patent: Dec. 7, 2010

(54) MECHANICAL STRUCTURE INCLUDING A LAYER OF POLYMERISED LIQUID CRYSTAL AND METHOD OF MANUFACTURING SUCH

(75) Inventors: Dirk Jan Broer, Eindhoven (NL); Christiane Maria Rosette De Witz, Eindhoven (NL); Grietje Neeltje Mol, Eindhoven (NL); Roel Penterman, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 865 days.

(21) Appl. No.: 10/597,569

(22) PCT Filed: Jan. 27, 2005

(86) PCT No.: PCT/IB2005/050356

§ 371 (c)(1),
(2), (4) Date: Jul. 31, 2006

(87) PCT Pub. No.: WO2005/076247

PCT Pub. Date: Aug. 18, 2005

(65) Prior Publication Data

US 2008/0259253 A1 Oct. 23, 2008

(30) Foreign Application Priority Data

Feb. 4, 2004 (EP) .................... 04100399

(51) Int. Cl.
*G02F 1/1333* (2006.01)

(52) U.S. Cl. ......................................................... 349/86
(58) Field of Classification Search ....................... None
See application file for complete search history.

(56) References Cited

U.S. PATENT DOCUMENTS

| 4,896,292 A | * | 1/1990 | Eich et al. .................... 365/108 |
| 5,843,539 A | * | 12/1998 | Harvey et al. ................. 428/1.3 |
| 7,425,253 B2 | * | 9/2008 | Voldman et al. ............. 204/547 |

* cited by examiner

*Primary Examiner*—David Nelms
*Assistant Examiner*—Lucy P Chien

(57) ABSTRACT

A mechanical structure comprises an element which is moveable by nonmechanical means, such as heat or radiation, between a first state having a first shape and a second state having a second shape different. To this end, the element includes a layer of oriented polymerized liquid crystal which exhibits an anisotropic expansion when subjected to such means. In order to facilitate manufacture the element is positioned on a substrate which has a region of high adhesiveness and a region of low adhesiveness for polymerized liquid crystal. To manufacture such structures a layer of oriented polymerizable liquid crystal is formed on a substrate (201) which is provided with a patterned surface that provides adhesive regions (204) with high adhesiveness to polymerized liquid crystal and nonadhesive regions (203) with low adhesiveness to polymerized liquid crystal. After polymerization, for example a thermal shock is applied which causes the layer of polymerized liquid crystal to delaminate at the non-adhering region while remaining fixed to the adhesive regions. Thus, the method does not require time-consuming underetching steps.

15 Claims, 2 Drawing Sheets

Figure 1:
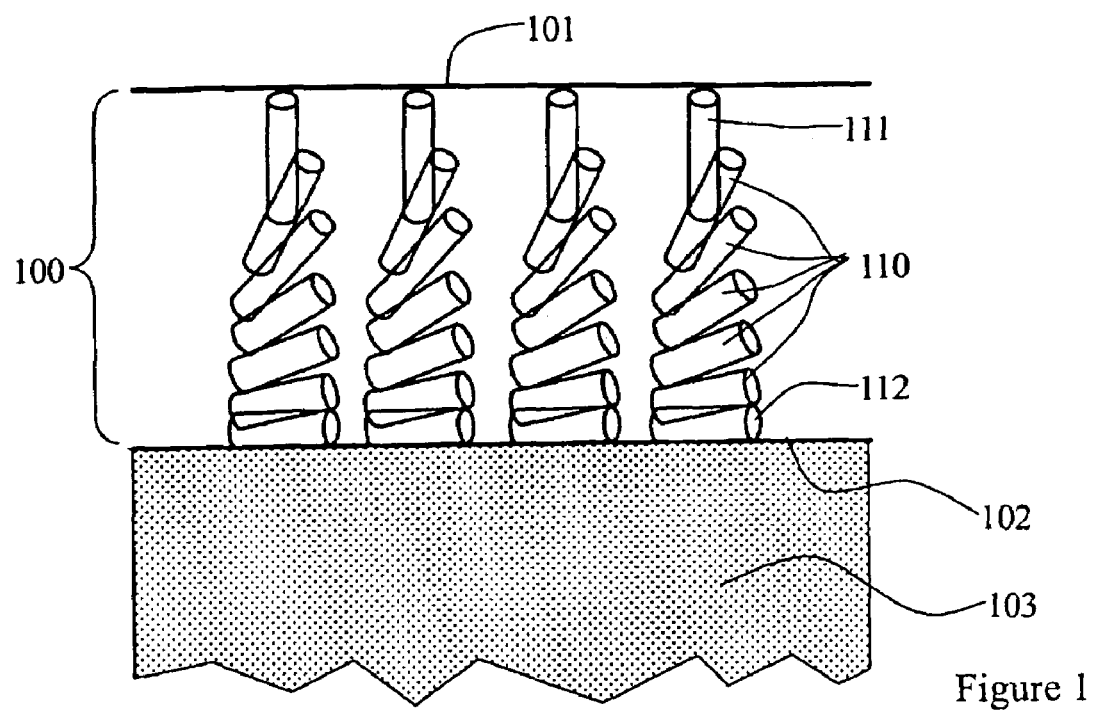

MECHANICAL STRUCTURE INCLUDING A LAYER OF POLYMERISED LIQUID CRYSTAL AND METHOD OF MANUFACTURING SUCH

The present invention relates generally a mechanical structure and in particular to a mechanical structure comprising an element which is moveable by non-mechanical means between a first and a second state.

The invention also relates to a method of manufacturing such a mechanical structure.

A mechanical structure as described in the opening paragraph is disclosed U.S. Pat. No. 4,235,522. U.S. Pat. No. 4,235,522 discloses a roll-up device. The roll-up device comprises a number of flexible polyester strips each having a thickness of the order of 1 to 5 µm and each coated with a thin aluminum layer. The polyester strip is stretched and one end thereof adhered to a substrate the other end remains free and is curled. The substrate is provided with a transparent ITO (indium tin oxide) counter electrode. When a voltage is applied between the aluminum and ITO electrode an electric field is set up between the electrodes which makes the curled free end uncurl and lay flat against the substrate. Since the aluminum layer renders the strip opaque the strip is a mechanical shutter moveable by non-mechanical means.

The polyester strip is made by laminating a polymer film on the substrate and then laser cutting the strip. Due to the mechanical stresses in the stretched film the free end curls up, if desired aided by added mechanical stress and/or a heating step.

A disadvantage of the above device is that the cutting process normally limits the resolution of the device. Laser processes for cutting are limited by the dimensions of the laser beam and cutting lines therefore have the dimension of tens of micrometers or larger.

Another disadvantage is that stretching induces to some extent a biaxial orientation which gives a double curling of the strips limiting the accuracy of the roll-up mechanism.

It is an object of the invention to provide a mechanical element which is moveable between a first state having a first state and a second state having a second shape different form the first which can be accurately and easily manufactured.

These and other objects are achieved with a mechanical structure comprising a substrate and a layer of an oriented polymerized liquid crystal forming an element on said substrate, wherein said element is locally adhered to an adhering region of said substrate and is delaminated from said substrate at a non-adhering region of said substrate, where said adhering region has a higher adhesiveness to the oriented polymerized liquid crystal than said non-adhering region; and wherein the oriented polymerized liquid crystal of said layer has an anisotropic orientation such as to render the element moveable by non-mechanical means between a first state having a first shape and a second state having a second shape different from the first.

The mechanical structure according to the present invention is advantageous in that it can be manufactured without use of under-etching. Instead, the substrate is patterned with adhering and non-adhering regions, to which the polymerizing liquid crystal mixture adheres permanently or from which the polymerized liquid crystal mixture is easily separated respectively.

The substrate can thus be provided with regions having high adhesiveness to polymerized liquid crystal where the element should be attached to the substrate, and with regions having low adhesiveness to polymerized liquid crystal where the element should be movable in relation to the substrate. Thus, for example, light shutters comprising a free standing rectangular shutter element hinged on the substrate at one edge can be manufactured by providing a rectangular non-adhering region and an adjacent strip of adhering region on the substrate and by subsequently polymerizing liquid crystal mixture on both regions.

Depending on the application at hand, the mechanical structure includes one or more elements. For example, a plurality of elements can be arranged along rows and columns in an array configuration. In such case each element may or may not be separately controllable.

According to one embodiment, said non-mechanical means include a variation in temperature.

According to this embodiment, the element is essentially straight when having a first temperature and is bent when having a second, different temperature. Such temperature dependent behavior may be provided by selecting a suitable orientation of the polymerized liquid crystal. The orientation is preferably twisted nematic or splayed. It relies on the fact that liquid crystals such as polymerized liquid crystals have a different coefficient of thermal expansion along their longitudinal axes than along the direction perpendicular to those axes.

As an alternative to heat responses, or in combination therewith, the polymerized liquid crystal can expand and contract anisotropically in response to electromagnetic radiation, e.g. ultraviolet radiation, depending on the orientation of the liquid crystal molecules. By suitable orientation of the molecules and by using liquid crystal molecules that expand and contract in response to electromagnetic radiation, this effect can be exploited in similar fashion as the heat response effect. Thus, according to another embodiment, said non-mechanical means include exposure to electromagnetic radiation of different wavelengths.

The orientation of the polymerized liquid crystal can be provided in different manners, for example by polymerizing the layer in contact with a temporary, orientating and/or surfactant substrate, and/or by adding certain additives, such as chiral molecules, to the mixture.

However, the orientation must often be well defined in relation to the substrate, since the element to some extent is fixed to the substrate and should be movable in a predetermined manner in relation to the substrate. Therefore, according to one embodiment, the substrate includes an orientation layer a surface of which comprises at least said non-adhering region.

The orienting layer can for example be a rubbed polyimide layer. The molecule orientation typically needs to be well defined in the entire element, and in particular in the portion that is not fixed to the substrate. Therefore the orientation layer preferably extends over both the adhering and the non-adhering regions. However, depending on the application at hand more restricted orientation layers or orientation layers having different rubbing directions in different regions are envisaged as well.

There are different ways of providing the adhering region and/or non-adhering region.

According to one embodiment, said non-adhering region is formed of an apolar polyimide surface and said adhering region is formed of a polar polyimide surface obtainable by oxidizing an apolar polyimide surface.

The apolar polyimide can for example be a polyimide that is provided with alkyltails such as octyl, decyl or octadecyl or that is modified with fluorinated units. Because of their low polarity the adhesion of the liquid crystalline acrylate networks is normally small. The adhesion can however be selectively enhanced by a local treatment of the rubbed polyimide with an oxygen plasma while for example covering the regions that should remain less adhering with a contact mask. The thereby oxidized areas adhere well to polymerizable liquid crystal and the adhered zones withstand for instance temperature cycling. The adhesiveness of the non-treated areas is far lower, and the polymerized liquid crystal is easily releasable by for example controlled temperature cycling or treatment with a surfactant solution in water.

According to another embodiment, at the adhering region, the polymerized liquid crystal is covalently bonded to the substrate.

For example, a layer of rubbed apolar polyimide having low adhesiveness as described above (a suitable material is Nissan7511, commercially available from Nissan Co) is selectively printed with a polyimide that adheres well to the liquid crystal mixture network, for instance by an off-set printing method, by screen printing or by microcontact printing using a flexible mould or stamp. The latter polyimide preferably contains reactive groups that can form covalent bonds with the polymerizing liquid-crystalline monomers (a suitable material is ZL12650, commercially available from Merck). Alternatively, a non-adhering polyimide can be selectively printed on an adhering polyimide leaving the desired adhering regions open for reaction with the polymerizable liquid crystal. Alternatively it is possible to use polytetrafluoreethylene (Teflon) as a non-adhering orientation layer. Monolayers of this material can be applied in an aligned form by rubbing a Teflon rod at elevated temperatures of 220° C. or higher in a patterned way on a substrate that is previously covered with an adhering layer. Furthermore, in case the substrate is formed out of for example glass, it can be coated with a coupling agent such as 3-aminoprpoyl trimethoxy silane or methacryloxypropyl trimethoxy silane. Such a coupling agent gives rise to increased adhesion at the coated areas. Optionally non-adhering polyimide can be printed and rubbed on top of the coupling agent.

As described above, the element can be controllable by means of heat and/or electromagnetic radiation. Even though these approaches are very versatile for many applications, they are somewhat restricted when it comes to for example computer control, such as control by a drive unit in a display device using the elements as pixilated shutter elements.

To this end, in one embodiment said non-mechanical means include a control electrode provided on said element and a ground electrode provided on said substrate, such that said element is moveable between said first and second state by means of electrostatic forces set up between said control and ground electrode.

Thereby the element is controllable between for example a straight shape and a bent shape by means of electrostatic forces between said electrodes. The electrostatic forces are easily applied by applying a voltage between the electrodes. The control electrode might for example be formed out of aluminum that is applied by means of sputtering. The ground electrode might for example be formed out of ITO, in the same way as described earlier. In case an ITO electrode is provided on the substrate, this is preferably done before providing the adhering and non-adhering regions. The adhering and non-adhering regions can typically be provided on the substrate in the same manner independent of whether or not an electrode provided. In case a plurality of elements having electrodes are arranged on the same substrate, the electrodes are preferably interconnected with a drive circuitry arranged on the substrate and driven by a drive unit. For example, in case the elements are used as pixel elements in a display application, the elements are typically arranged in an array configuration and the respective electrodes are for example arranged in rows and columns in conventional manner.

Another aspect of the present invention provides a method of manufacturing a mechanical structure as described above.

The invention relates to a method of manufacturing a mechanical structure comprising a substrate and a layer of an oriented polymerized liquid crystal forming an element on said substrate, wherein the oriented polymerized liquid crystal of said layer has an anisotropic orientation such as to render the element moveable by non-mechanical means between a first state having a first shape and a second state having a second shape different from the first, said method comprising the steps of:

providing a substrate that has a patterned surface comprising an adhering region and a non-adhering region, wherein said adhering region has a higher adhesiveness to the polymerized liquid crystal than said non-adhering region;

applying a layer of polymerizable liquid crystal on said patterned surface; orienting the polymerizable liquid crystal in said layer;

polymerizing said oriented polymerizable liquid crystal to provide a layer of oriented polymerized liquid crystal which layer adheres well to the adhering region and less well to the non-adhering region; and delaminating said layer of oriented polymerized liquid crystal mixture from the substrate at the said non-adhering region.

A fundamental difference compared to alternative methods of manufacturing is thus that this approach does not require any under-etching steps. The selective adhesion between the element and the substrate is instead provided for by the patterned adhesiveness of the substrate during polymerization. The step of separating the layer of polymerized liquid crystal can thereby be performed without use of under-etching. Instead, the device is can be exposed to a thermal shock by first heating it and then rapidly cooling it. The thermal shock gives rise to enough stress in the polymerized liquid crystal layer to break each individual element loose from the non-adhesive regions of the substrate and to curl themselves. The delamination can be further stimulated by combining the thermal shock with a dip in ethanol and/or treatment with supercritical $CO_2$.

According to one embodiment, the step of providing a substrate that has a patterned surface includes providing selectively at the adhering region an orientation layer including chemical groups which are capable of reacting with the polymerizable liquid crystal mixture, such as an oriented polyimide layer including acrylate groups.

According to another embodiment, the step of providing a substrate that has a patterned surface, includes providing selectively at said non-adhering region an orientation layer including inhibiting groups which inhibit polymerization of the polymerizable liquid crystal mixture adjacent said non-adhering region.

The orientation layer, which can be a conventional polyimide orientation layer (such as AL3046, commercially available from JSR Co), is modified in the sense that free-radical polymerization inhibitors are added. When an acrylate polymer is polymerized by a free-radical mechanism such as normally used for photo-initiated polymerization, the polymerization does not proceed in the interface as all free radicals are effectively scavenged by the inhibitor. A suitable inhibitor is p-methoxyphenol. This material might however be too volatile for some applications depending on the baking temperature of the polyimide. A less volatile inhibitor is preferably selected for such applications, for example anthraquinone or bromophenol blue (available from Sigma). Due to interfacial inhibition the adhesion is low and the polymer film is easily removed by soaking in solvents like propanol-2. Locally increased adhesion can be obtained by selectively printing a non-modified polyimide on top of the inhibitor-modified polyimide. Such a top layer shields the curing monomer mixture from the inhibitor and the polymerized film adheres well. In a preferred embodiment the printed polyimide contains reactive groups (such as ZLI 2650, commercially available from Merck).

In another embodiment, the step of providing a substrate that has a patterned surface includes providing an apolar polyimide orientation layer at said adhering and non-adhering region and selectively oxidizing said polyimide orientation layer at said adhering region to render the adhering region polar.

As stated above, the polymerized liquid crystal is to have an orientation in the element which is well-defined in relation to the substrate in order to provide a well-defined motion in relation to the substrate.

Therefore, according to one embodiment the method of manufacturing further comprises the step of providing an orientation layer before applying the polymerizable liquid crystal to orient the polymerizable liquid crystal.

The orientation layer can extend over the entire patterned surface (including both the adhesive and the non-adhesive regions), or it can be restricted to portions thereof. Depending on the application at hand, the orientation layer might also have different orientation directions in different regions, thus providing for different liquid crystal molecule orientations in different portions of the element.

According to one embodiment, the polymerized liquid crystal has a twisted nematic orientation.

According to an embodiment of the method in accordance with the invention, such a twisted nematic order can be obtained if the polymerizable liquid crystal comprises chiral molecules.

In such case, the molecule twist should preferably be well defined and can for example be 90° between the substrate and the air interface of the layer. Such a twisted nematic orientation can be promoted by adding chiral molecules to the polymerizable liquid crystal. However, adding chiral molecules and subsequently polymerizing the layer in open air will always result in a relatively large orientational spread among the molecules, some will be twisted more than 90° and some will be twisted less than 90°. Therefore it is beneficial to hold a temporary substrate having an orientation layer with a desired orientation direction parallel with and on the opposite side of the substrate during polymerization. The temporary substrate will then ensure an essentially uniform orientation of the polymerizable liquid crystal present adjacent such temporary substrate.

Preferably the temporary substrate is combined with an orientation layer on the substrate as well.

Thus, according to one embodiment, said step of polymerizing said polymerizable liquid crystal includes the step of bringing, on the side facing away from the substrate, the polymerizable liquid crystal into contact with an orientation layer to provide the polymerizable liquid crystal at that side with an orientation which is different from the orientation induced in the polymerizable liquid crystal adjacent the substrate. In case of a twisted nematic orientation both orientation layers are planar orientation layers where the direction of orientation differs by 90°.

In case of a splayed order, one orientation layer is a planar orientation layer, thus providing the polymerizable liquid crystal with a planar orientation and the other is a homeotropic alignment layer.

Thus, more specifically, according to one embodiment for providing a splayed order, the orientation layer provided on the side facing away from the substrate has a surface functionalized with surfactants providing the polymerizable liquid crystal adjacent said orientation layer with a homeotropic orientation.

Alternatively, said polymerizable liquid crystal comprises a monomer that has a polar end and an apolar end rendering the monomer capable of inducing a homeotropic orientation at a surface of the layer of polymerizable liquid crystal which is in contact with air.

Of course, use of such a monomer can be combined with the use of a temporary surfactant substrate during polymerization, whereby the homeotropic orientation is ensured by both measures in combination.

Figure 2:
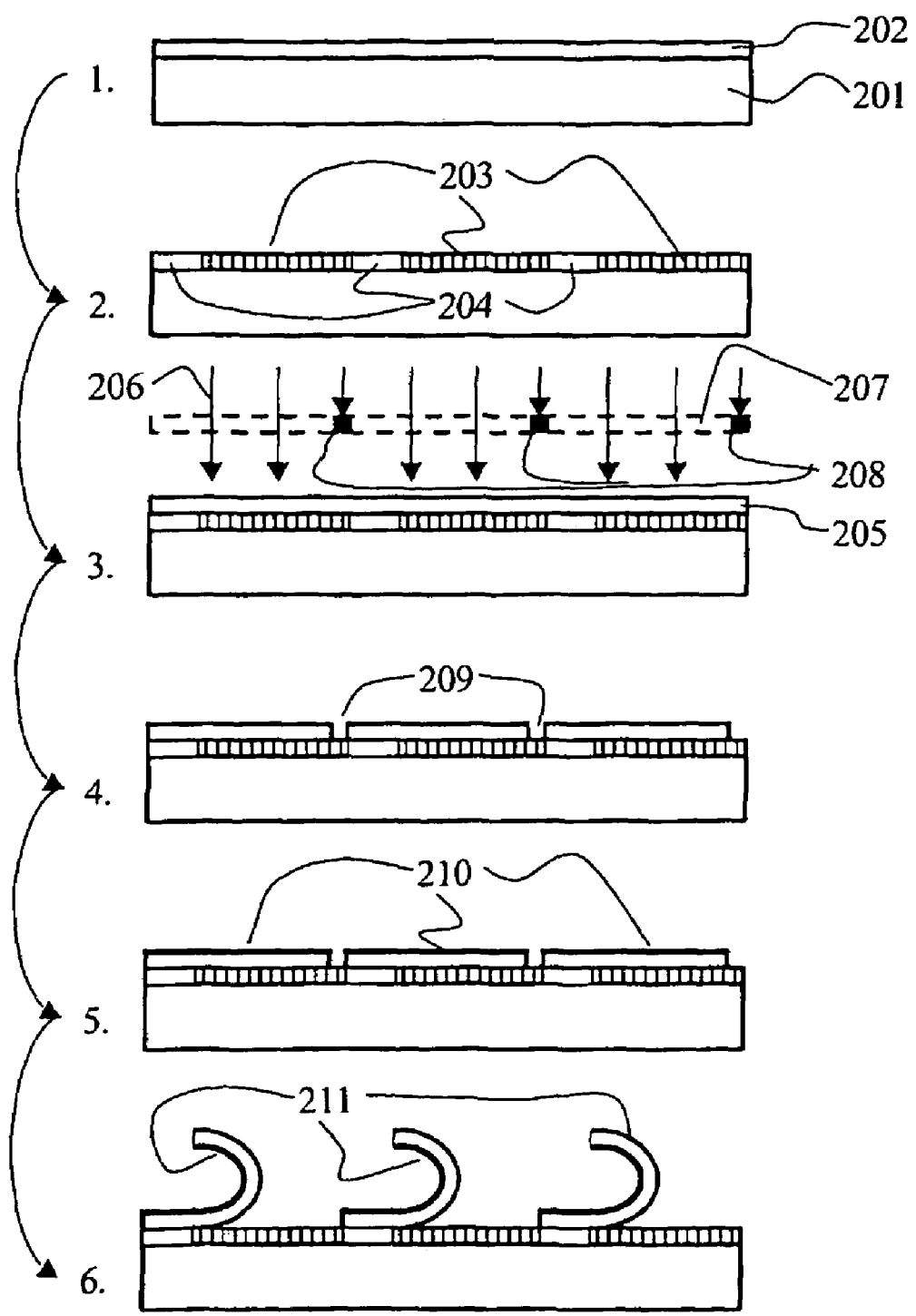

The present invention will now be further described in detail with reference to the accompanying, exemplifying drawings In the drawings:

FIG. 1 illustrates, schematically in a cross-sectional view, an element having a layer of polymerized liquid crystal in a splayed orientation; and FIG. 2 illustrates, schematically in a cross-sectional view, several stages of a method of manufacturing a mechanical structure according to the present invention.

Thus, FIG. 1 illustrates a layer 100 of polymerized liquid crystal having a splayed molecular orientation. A lower surface 102 of the layer 100 is adhered to a substrate 103 and an upper surface 101 opposing the lower surface 102 interfaces air. In this particular layer, the molecules 112 at the lower surface 102 are oriented parallel with the lower surface and the molecules 111 at the upper surface 101 are oriented perpendicular to the upper surface. The intermediate molecules 110 are gradually tilted between the parallel and the perpendicular (homeotropic) orientation.

In effect, the polymerized liquid crystal as well as the polymerizable liquid crystal form which it is obtained has a 90° splayed orientation. Any polymerizable liquid crystal that is polymerized in this orientation and that has a different coefficient of thermal expansion along the longitudinal direction of the molecules than along the radial direction will bend in response to temperature variations.

As an alternative, a twisted nematic orientation can be induced and would provide similar properties as the homeotropic orientation provided that the liquid crystal mixture has an anisotropic coefficient of thermal expansion.

As stated previously, some (polymerized) liquid crystals respond with anisotropic expansion in responses to electromagnetic radiation (e.g. ultraviolet light) instead of or in combination with temperature responses. In such case the polymerized liquid crystal layer can instead be controlled using such electromagnetic radiation.

A straightforward method of manufacturing a mechanical structure according to the present invention is illustrated in FIG. 2. Thus, a substrate 201 is provided with a patterned orientation layer having low adhesion regions 203 alternated with highly adhering regions 204. The patterned orientation layer can for example be a layer of rubbed apolar polyimide 202 that is selectively oxidized by mask-wise exposure with deep UV light in air. Thereby the surface becomes locally oxidized and the resulting increased polarity at the selected areas 204 improves adhesion. In such case manufacturing step (1.) involves the provision of an apolar, rubbed polyimide layer, and the subsequent step (2.) involves mask-wise ultraviolet radiation of the adhering regions.

Alternatively a thin layer of an adhering polyimide can be printed locally in the adhering regions 204 of the substrate, thus promoting adhesion between the substrate and the polymerizing liquid crystal mixture at those particular locations. The adhering polyimide can, for example, be a polyimide that is provided with reactive acrylate groups as is illustrated below:

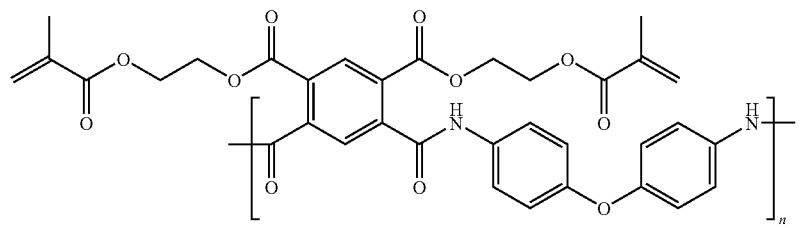

This reactive polyimide adheres well to a uniaxially aligning polyimide orientation layer on the substrate.

Once the adhering 204 and non-adhering 203 regions of the orientation layer are provided, a layer 205 of polymerizable liquid crystal is provided on the orientation layer 203, 204. A convenient layer thickness is for instance 6 μm. Once applied, the layer is selectively cured at an elevated temperature by means of ultraviolet radiation 206 exposed through a mask 207 leaving narrow strips 208 unexposed and thus uncured. The polymerizable liquid crystal can be applied using spin-coating or by a doctors blade. When the curing is carried out at an elevated temperature, the resulting polymer film (i.e. the mechanical structure) tends to be stretched at high temperatures and to curl if the temperature is reduced.

Thereafter the device is slowly cooled to room temperature. A too rapid temperature change might induce too high stress in the layer, which would then delaminate from the non-adhering regions 203 of the substrate. When at room temperature, the uncured polymerizable liquid crystal is removed by a solvent such as THF. The resulting gaps 209 in the polymerized liquid crystal thereby define separate elements. In case the elements are to be controlled by means of electric voltages a thin layer 210 of aluminum is applied on the layer 205 of polymerized liquid crystal in step 5, thus forming electrodes on the elements. However, this step can be omitted in case the electrodes are not needed or the aluminum can be exchanged for some other material. In case no electrode is needed, one might still apply an opaque or a colored layer in order to define optical properties of the structure.

Finally, in step 6, the device is exposed to a thermal shock by first heating it and then rapidly cooling it. The thermal shock gives rise to enough stress in the polymerized layer 205 to break each individual element 211 loose from the non-adhesive regions of the substrate and which then curl themselves. The delamination can be further stimulated by combining the thermal shock with a dip in ethanol and/or treatment with supercritical $CO_2$.

Depending on the polymerizable liquid crystal at hand, the photo-crosslinking reaction might be based on a free-radical mechanism. In such case the method can be further improved by providing the orientation layer with a modification that locally inhibits the photo-crosslinking reaction of the liquid crystal acrylate mixture. Thereto the polyimide is provided with inhibitor groups. Such inhibitors which are as such well known in the art scavenge free radicals. Examples of such groups are for instance compounds that are normally added in small amounts to reactive mixtures to stabilize shelf life or reduce photodegradation. Convenient compounds are phenolic compounds such as 1,4 benzoquinone or p-methoxyphenol added in a quantity of a few percent to the polyimide. However, because most polyimides require high-temperature baking, less volatile inhibitors are preferred. Even better are covalently bonded inhibiting moieties. Other examples of inhibitors are: tert-butyl catechol phenothiazine, N,N'-bis-sec-butyl-p-phenylene diamine, p-nitrosophenol, 2,2,6,6-tetramethyl-1-oxyl-piperidine (TEMPO) and 4-acetoxy-2,2,6,6-tetramethyl-1-oxylpiperidine (4-acetoxy-TEMPO).

Of course, other polymerization mechanisms than free-radical mechanisms can be utilized. In such case other inhibitors should be applied. For example, in case cationic polymerization is utilized mechanisms inhibiting anions or other inhibiting basic groups such as amines can be utilized. The addition of inhibitors to the orientation layer (e.g. to the polyimide) prevents cross-linking near the interface. As a result the interfacial adhesion between the substrate and the polymerized liquid crystal is substantially reduced.

In other words, the present invention provides a novel mechanical structures having at least one element comprising a layer of oriented polymerized liquid crystal 202 and a method of manufacturing such mechanical structures. The oriented polymerized liquid crystal layer exhibits an anisotropic expansion when subjected to non-mechanical means such as heat or electromagnetic radiation, as a result of which the element bends and straightens in response to such non-mechanical means.

A mechanical structure having such an element may be manufactured by polymerizing a layer of oriented polymerizable liquid crystal on a substrate 201 which is provided with a patterned surface that provides adhesive regions 204 with high adhesiveness to polymerized liquid crystal and non-adhesive regions 203 with low adhesiveness to such liquid crystal. Thus, the element 211 is easily separable from the substrate at the non-adhesive regions while remaining fixed to the adhesive regions, without using time-consuming under-etching steps.

The mechanical structure of the present invention have a variety of applications. In one the mechanical structure is used for modulating a light beam.

Others are pumps and valves in microfluidic devices, movable mirrors and shutter in integrated micro-optical devices, actuators in micro-robots and as driving mechanisms in micro-motors and micro-machines, containers for controlled drug release.

The invention claimed is:

1. A mechanical structure comprising a substrate and a layer of an oriented polymerized liquid crystal forming an element on said substrate, wherein said element is locally adhered to an adhering region of said substrate and is delaminated from said substrate at a non-adhering region of said substrate, where said adhering region has a higher adhesiveness to the polymerized liquid crystal than said non-adhering region; and wherein the oriented polymerized liquid crystal of said layer has an anisotropic orientation such as to render the element moveable by non-mechanical means between a first state having a first shape and a second state having a second shape different from the first.

2. A mechanical structure according to claim 1, wherein said non-mechanical means include a variation in temperature.

3. A mechanical structure according to claim 1, wherein said non-mechanical means include exposure to electromagnetic radiation of different wavelengths.

4. A mechanical structure according to claim 2, wherein the substrate includes an orientation layer a surface of which comprises at least said non-adhering region.

5. A mechanical structure according to claim 1 wherein said non-adhering region is formed of an apolar polyimide surface and said adhering region is formed of a polar polyimide surface obtainable by oxidizing an apolar polyimide surface.

6. A mechanical structure according to claim 1 wherein, at the adhering region, the polymerized liquid crystal is covalently bonded to the substrate.

7. A mechanical structure according to claim 5, wherein said non-mechanical means include a control electrode provided on said element and a ground electrode provided on said substrate, such that said element is moveable between said first and second state by means of electrostatic forces set up between said control and ground electrode.

8. A mechanical structure as claimed in claim 1 wherein the polymerized liquid crystal has a twisted nematic orientation.

9. A method of manufacturing a mechanical structure comprising a substrate and a layer of an oriented polymerized liquid crystal forming an element on said substrate, wherein the oriented polymerized liquid crystal of said layer has an anisotropic orientation such as to render the element moveable by non-mechanical means between a first state having a first shape and a second state having a second shape different from the first, said method comprising:
  providing a substrate that has a patterned surface comprising an adhering region and a non-adhering region, wherein said adhering region has a higher adhesiveness to the polymerized liquid crystal than said non-adhering region;
  applying a layer of polymerizable liquid crystal on said patterned surface;
  orienting the polymerizable liquid crystal in said layer;
  polymerizing said oriented polymerizable liquid crystal to provide a layer of oriented polymerized liquid crystal which layer adheres well to the adhering region and less well to the non-adhering region; and
  delaminating said layer of oriented polymerized liquid crystal mixture from the substrate at the said non-adhering region.

10. A method according to claim 9, wherein the step of providing a substrate that has a patterned surface includes providing selectively at the adhering region an orientation layer including chemical groups which are capable of reacting with the polymerizable liquid crystal mixture, such as an oriented polyimide layer including acrylate groups.

11. A method according to claim 9, wherein the step of providing a substrate that has a patterned surface includes providing selectively at said non-adhering region an orientation layer including inhibiting groups which inhibit polymerization of the polymerizable liquid crystal mixture adjacent said non-adhering region.

12. A method according to claim 9, wherein said step of polymerizing said polymerizable liquid crystal includes the step of bringing, on the side facing away from the substrate, the polymerizable liquid crystal into contact with an orientation layer to provide the polymerizable liquid crystal at that side with an orientation which is different from the orientation induced in the polymerizable liquid crystal adjacent the substrate.

13. A method according to claim 12, wherein the orientation layer provided on the side facing away from the substrate has a surface functionalized with surfactants providing the polymerizable liquid crystal adjacent said orientation layer with a homeotropic orientation.

14. A method according to claim 9, wherein said polymerizable liquid crystal comprises a monomer that has a polar end and an apolar end rendering the monomer capable of inducing a homeotropic orientation at a surface of the layer of polymerizable liquid crystal which is in contact with air.

15. A method of manufacturing a mechanical structure comprising a substrate and a layer of an oriented polymerized liquid crystal forming an element on said substrate, wherein the oriented polymerized liquid crystal of said layer has an anisotropic orientation such as to render the element moveable by non-mechanical means between a first state having a first shape and a second state having a second shape different from the first, the method comprising:
  providing a substrate comprising a patterned surface comprising an adhering region and a non-adhering region, the providing said substrate further comprising:
  providing an apolar polyimide orientation, said patterned surface comprising an adhering region and a non-adhering region, wherein said adhering region has a higher adhesiveness to the polymerized liquid crystal than said non-adhering region; and selectively oxidizing said polyimide orientation layer at said adhering region to render the adhering region polar;
  applying a layer of polymerizable liquid crystal on said patterned surface; orienting the polymerizable liquid crystal in said layer;
  polymerizing said oriented polymerizable liquid crystal to provide a layer of oriented polymerized liquid crystal which layer adheres well to the adhering region and less well to the non-adhering region; and
  delaminating said layer of oriented polymerized liquid crystal mixture from the substrate at the said non-adhering region.

* * * * *